(12) United States Patent
Tiwari et al.

(10) Patent No.: US 10,181,852 B1
(45) Date of Patent: Jan. 15, 2019

(54) VOLTAGE TRANSLATOR WITH OUTPUT SLEW RATE CONTROL

(71) Applicant: NXP B.V., Eindhoven (NL)

(72) Inventors: Chandra Prakash Tiwari, Bangalore (IN); Michael Joehren, San José, CA (US)

(73) Assignee: NXP B.V., San Jose, CA (US)

(*) Notice: Subject to any disclaimer, the term of this patent is extended or adjusted under 35 U.S.C. 154(b) by 0 days.

(21) Appl. No.: 16/011,661

(22) Filed: Jun. 19, 2018

(51) Int. Cl.
  *H03K 19/00* (2006.01)
  *H03K 19/003* (2006.01)
  *H03K 3/356* (2006.01)

(52) U.S. Cl.
  CPC . *H03K 19/00361* (2013.01); *H03K 3/356113* (2013.01); *H03K 19/00384* (2013.01)

(58) Field of Classification Search
  None
  See application file for complete search history.

(56) References Cited

U.S. PATENT DOCUMENTS

| | | | |
|---|---|---|---|
| 5,479,124 A | 12/1995 | Pun et al. | |
| 5,623,216 A | 4/1997 | Penza et al. | |
| 5,896,043 A | 4/1999 | Kumagai | |
| 6,437,622 B1 | 8/2002 | Tinsley et al. | |
| 6,704,818 B1 | 3/2004 | Martin et al. | |
| 6,734,705 B2 | 5/2004 | Pulkin et al. | |
| 7,187,197 B2 | 3/2007 | Tripathi et al. | |
| 7,365,584 B2 | 4/2008 | Bennett et al. | |
| 7,446,576 B2 | 11/2008 | Fiedler | |
| 7,471,111 B2 | 12/2008 | Seth et al. | |
| 7,683,672 B2 | 3/2010 | Bartlett | |
| 7,768,433 B2 | 8/2010 | Mathe et al. | |
| 8,120,412 B2 | 2/2012 | Pelley | |
| 8,198,916 B2 | 6/2012 | Sood et al. | |
| 8,633,738 B2 | 1/2014 | Chen et al. | |
| 8,698,520 B2 | 4/2014 | Mei | |
| 9,112,486 B2 | 8/2015 | Anderson | |
| 9,294,078 B1 | 3/2016 | Verma et al. | |
| 9,496,873 B2 | 11/2016 | Li et al. | |
| 2008/0164932 A1* | 7/2008 | Welty | H03K 19/018585 327/333 |
| 2009/0289693 A1* | 11/2009 | Motamed | H03K 19/00315 327/437 |
| 2009/0295429 A1* | 12/2009 | Hori | H03K 19/0175 326/80 |
| 2012/0169381 A1 | 7/2012 | Mei | |

* cited by examiner

*Primary Examiner* — Jany Richardson
(74) *Attorney, Agent, or Firm* — Charles E. Bergere

(57) ABSTRACT

A bidirectional voltage translator shifts a voltage level of a first voltage signal to generate a second voltage signal, and vice-versa. The voltage translator includes first and second I/O terminals for receiving and outputting the first and second voltage signals, respectively, and first and second one-shot circuits connected to first and second output transistors, respectively. The outputs of the transistors are connected to the first and second I/O terminals, respectively, and also are fed back to the respective one-shot circuits. When the output of the voltage translator has a high slew-rate, the one of the first and second one-shot circuits that corresponds to the output modulates the gate voltage of the corresponding output transistor based on the feedback signal to control the slew-rate of the output.

20 Claims, 4 Drawing Sheets

VOLTAGE TRANSLATOR WITH OUTPUT SLEW RATE CONTROL

BACKGROUND

The present invention relates generally to electronic circuits, and, more particularly, to a voltage translator with a driver circuit for output slew-rate control.

Integrated circuits, such as system-on-chips (SoCs) and application specific integrated circuits (ASICs), include multiple voltage domains that operate at different voltage levels. A voltage translator is used as an interface between the voltage domains to resolve voltage incompatibilities. The voltage translator level shifts a voltage signal output by a first voltage domain, which operates at a first voltage level, to a second voltage level at which a second voltage domain operates.

An output voltage signal of the voltage translator changes based on an input voltage signal of the voltage translator. When the input voltage signal transitions from a first state to a second state, the output voltage signal may experience a high slew rate due to the distance (i.e., a long trace-length) between the voltage translator and the second voltage domain. The high slew rate results in an overshoot in the output voltage signal, which is undesirable because the voltage overshoot can damage circuitry in the second voltage domain and also can create significant EMI issues. A known technique to eliminate overshoot is to use a clamping circuit to clamp the overshoot in the output voltage signal. However, clamping circuits increase the cost and complexity of the voltage translator and have a limited effect on EMI suppression.

Therefore, it would be advantageous to have a voltage translator with a driver circuit that controls a slew rate of an output voltage signal of the voltage translator, thereby preventing overshoot in the output voltage signal.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
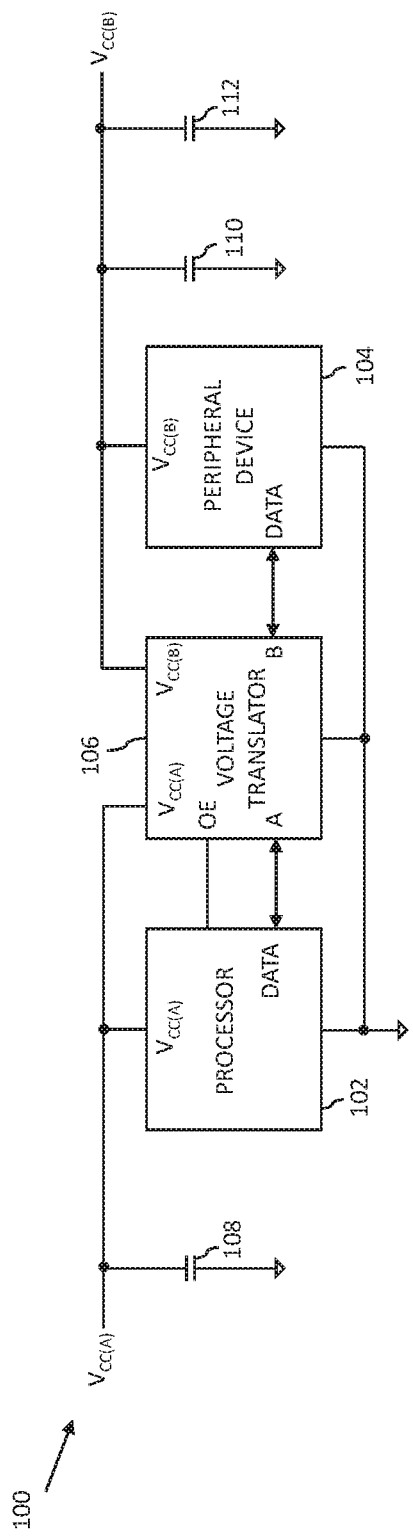
FIG. 1 is a schematic block diagram of a bidirectional communication system in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a bidirectional voltage translator. The voltage translator includes first and second one-shot circuits, and first and second output transistors. The first one-shot circuit receives a first voltage signal and generates a first pulse signal when the first voltage signal transitions from a first state to a second state. The first one-shot circuit further receives a second voltage signal, and generates a first gate driver signal using the second voltage signal and the first pulse signal. The first output transistor is connected to the first one-shot circuit for receiving the first gate driver signal and generating the second voltage signal. The second voltage signal is fed back to the first one-shot circuit to control a first gate voltage of the first output transistor based on a slew-rate of the second voltage signal. The second one-shot circuit receives the second voltage signal, and generates a second pulse signal when the second voltage signal transitions from the first state to the second state. The second one-shot circuit further receives the first voltage signal, and generates a second gate driver signal using the first voltage signal and the second pulse signal. The second output transistor is connected to the second one-shot circuit for receiving the second gate driver signal and generating the first voltage signal. The first voltage signal is fed back to the second one-shot circuit to control a second gate voltage of the second output transistor based on a slew-rate of the first voltage signal.

In another embodiment, the present invention provides a system for interfacing a first digital device operating at a first voltage level with a peripheral device operating at a second voltage level that is different from the first voltage level. The system includes first and second one-shot circuits and first and second output transistors. The first one-shot circuit receives a first voltage signal from the first digital device and generates a first pulse signal when the first voltage signal transitions from a first state to a second state (e.g., low to high). The first one-shot circuit further receives a second voltage signal and generates a first gate driver signal using the second voltage signal and the first pulse signal. The first output transistor is connected to the first one-shot circuit for receiving the first gate driver signal and generating the second voltage signal. The second voltage signal is fed back to the first one-shot circuit to control a first gate voltage of the first output transistor based on a slew-rate of the second voltage signal. The second voltage signal also is provided to the peripheral device. The second one-shot circuit receives the second voltage signal and generates a second pulse signal when the second voltage signal transitions from the first state to the second state. The second one-shot circuit further receives the first voltage signal and generates a second gate driver signal using the first voltage signal and the second pulse signal. The second output transistor is connected to the second one-shot circuit for receiving the second gate driver signal and generating the first voltage signal. The first voltage signal is fed back to the second one-shot circuit to control a second gate voltage of the second output transistor based on a slew-rate of the first voltage signal. The first voltage signal also is provided to the processor.

Various embodiments of the present invention provide a bidirectional voltage translator or level shifter. The voltage translator includes first and second one-shot circuits and first and second output transistors. The one-shot circuits include first and second driver circuits for driving the first and second output transistors, respectively. At a given time, the voltage translator receives one of a first voltage signal and a second voltage signal as an input. When the first voltage signal is received as an input and transitions from a first state to a second state, the first driver circuit drives the first output transistor to generate the second voltage signal. The first driver circuit receives the second voltage signal as feedback for controlling a slew-rate of the second voltage signal. The first driver circuit includes a high-pass filter that generates an output based on the slew-rate of the second voltage signal and uses the output to control the drive capability of the first output transistor, thereby controlling the slew-rate of the second voltage signal. Similarly, the second driver circuit controls the drive capability of the second output transistor. The voltage translator may be used to interface a digital device, such as a processor operating at a first voltage level with a peripheral device operating at a second voltage level that is different from the first voltage level.

The first and second one-shot circuits enable the voltage translator to control the drive capabilities of the first and second output transistors, respectively, thereby resulting in a controlled slew-rate at the output of the voltage translator. Since the slew-rate of the voltage translator is controlled, overshoot of the output also is controlled, thereby eliminating the need for a clamping circuit and reducing EMI by lowering maximum dI/dt.

Referring now to FIG. 1, a schematic block diagram of a bidirectional communication system 100 in accordance with an embodiment of the present invention is shown. The bidirectional communication system 100 includes a processor 102, a peripheral device 104, and a voltage translator 106 that interfaces the processor 102 with the peripheral device 104.

The processor 102 is connected between a first supply voltage $V_{cc(A)}$ having a first voltage level (e.g., 1.8V) and ground, while the peripheral device is connected between a second supply voltage $V_{cc(B)}$ having a second voltage level (e.g., 3.6V) and ground. Thus, the second voltage level is different from the first voltage level. A voltage translator 106 is connected between the processor 102 and the peripheral device 104 for shifting the voltage levels of signals passed between the processor 102 and the peripheral device 104, which is indicated by the arrows from A and B to the Data inputs of the processor 102 and the peripheral device 104, respectively.

The processor 102 also provides an output enable (OE) signal to the voltage translator 106 for activating or deactivating the voltage translator 106. The processor 102 actually could be any digital device, but a processor is used here as an example. Some other examples include a microprocessor, a microcontroller, an application specific integrated circuit (ASIC), a system on a chip (SOC), etc. Some examples of the peripheral device 104 include a subscriber identification module (SIM) card, a secure digital (SD) card, and multimedia cards or interfaces such as SPI or I²C. However, it will be apparent to a person having ordinary skill in the art that the peripheral device 104 is not limited to the above-mentioned examples and can be any device that needs to be interfaced with the processor 102 and has a different operating voltage from the processor 102.

The data signal between the processor 102 and the voltage translator 106 is referred to as a first voltage signal (A) and the data signal between the peripheral device 104 and the voltage translator 106 is referred to as a second voltage signal (B).

The voltage translator 106 is a bidirectional level shifter that is connected to ground and receives the first and second supply voltages $V_{cc(A)}$ and $V_{cc(B)}$. The voltage translator 106 has first and second input/output (I/O) terminals A and B that are connected to the processor 102 and the peripheral device 104, respectively. For example, the first I/O terminal A receives the first voltage signal from the processor 102, level shifts it, and then transmits the level shifted signal as the second voltage signal to the peripheral device 104 by way of the second I/O terminal B. In the other direction, the second I/O terminal B receives the second voltage signal from the peripheral device 104, level shifts it, and then transmits the level shifted signal as the first voltage signal A to the processor 102 by way of the first I/O terminal A.

The bidirectional communication system 100 further includes first through third capacitors 108-112. The first capacitor 108 is connected between the first supply voltage $V_{cc(A)}$ and ground, and filters out voltage ripples in the first supply voltage $V_{cc(A)}$. The second and third capacitors 110 and 112 each are connected between the second supply voltage $V_{cc(B)}$ and ground, and filter out voltage ripples in the second supply voltage $V_{cc(B)}$.

Figure 2:
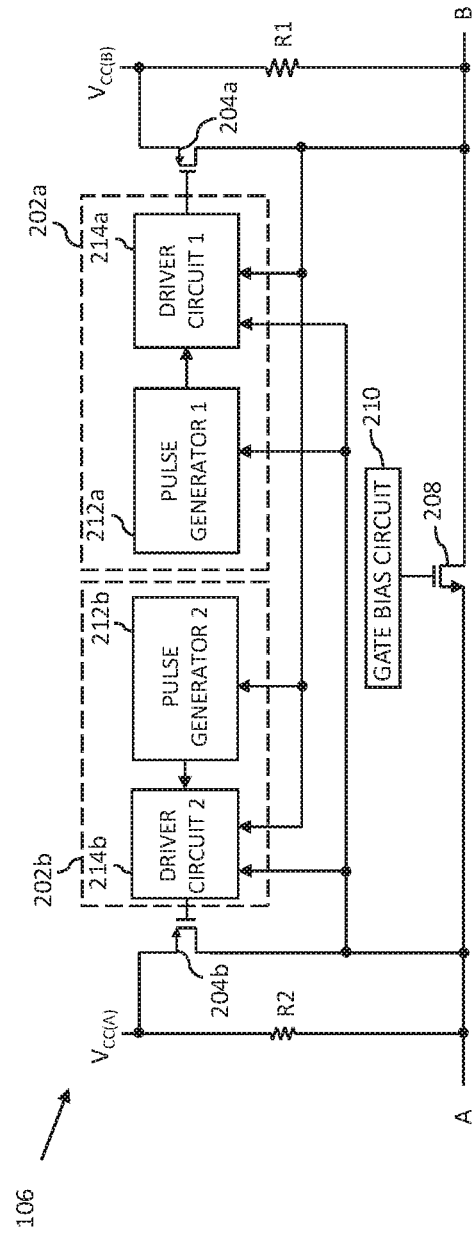
FIG. 2 is a schematic block diagram of a voltage translator used in the bidirectional communication system of FIG. 1, in accordance with an embodiment of the present invention.

Referring now to FIG. 2, a schematic block diagram of the voltage translator 106, in accordance with an embodiment of the present invention, is shown. FIG. 2 shows an open-drain configuration of the voltage translator 106. The voltage translator 106 includes first and second one-shot circuits 202a and 202b, first and second output transistors 204a and 204b, first and second resistors R1 and R2, a biasing transistor 208, and a gate bias circuit 210.

The first one-shot circuit 202a is connected to the first and second I/O terminals A and B for receiving the first and second voltage signals, respectively, and generates a first gate driver signal, which is provided to the gate of the first output transistor 204a. Similarly, the second one-shot circuit 202b is connected to the first and second I/O terminals A and B for receiving the first and second voltage signals, respectively, and generates a second gate driver signal, which is provided to the gate of the second output transistor 204b.

The first one-shot circuit 202a includes a first pulse generator 212a and a first driver circuit 214a. The first pulse generator 212a is connected to the first I/O terminal A and receives the first voltage signal. The first pulse generator 212a is activated when the first voltage signal A transitions from a first state to a second state (from low i.e., 0V to high i.e., 1.8V) and generates a first pulse signal. The first pulse signal has a fixed duration (e.g., 40 nanoseconds, ns). Examples of the first pulse generator 212a include a monostable multi-vibrator and a 555 timer.

The first driver circuit 214a is connected to the first pulse generator 212a and receives the first pulse signal. The first driver circuit 214a also is connected to the first I/O terminal A and receives the first voltage signal A. The first driver circuit 214a further receives the second voltage signal B as feedback from the drain of the first output transistor 204a, and generates the first gate driver signal based on the feedback signal and the first pulse signal.

The first output transistor 204a may be a p-channel metal-oxide semiconductor (PMOS) transistor having a source terminal connected to the second supply voltage $V_{cc(B)}$, a drain terminal connected to the second I/O terminal B, and a gate terminal connected to the first driver circuit 214a for receiving the first gate driver signal. The first resistor R1 is connected between the second supply voltage $V_{cc(B)}$, and the second I/O terminal B.

Similarly, the second one-shot circuit 202b includes a second pulse generator 212b and a second driver circuit 214b. The second pulse generator 212b is connected to the second I/O terminal B and receives the second voltage signal B. The second pulse generator 212b is activated when the second voltage signal B transitions from the first state to the second state (from low i.e., 0V to high i.e., 3.6V) and generates a second pulse signal. Like the first pulse signal, the second pulse signal has a fixed duration (e.g., 40 ns). Examples of the second pulse generator 212b include a monostable multi-vibrator and a 555 timer.

The second driver circuit 214b is connected to the second pulse generator 212b and receives the second pulse signal. The second driver circuit 214b also is connected to the second I/O terminal B and receives the second voltage signal. The second driver circuit 214b further receives a feedback signal from the drain of the second output transistor 204b, which is the first voltage signal A, and generates the second gate driver signal based on the first voltage signal and the second pulse signal.

The second output transistor 204b may be a PMOS transistor having a source terminal connected to the first supply voltage $V_{cc(A)}$, a drain terminal connected to the first I/O terminal A, and a gate terminal connected to the second driver circuit 214b for receiving the second gate driver signal. The second resistor R2 is connected between the first supply voltage $V_{cc(A)}$ and the first I/O terminal A.

The biasing transistor 208 may be an n-channel metal-oxide semiconductor (NMOS) transistor having source and drain terminals connected to the first and second I/O terminals A and B, respectively, and a gate terminal connected to the gate bias circuit 210. The gate bias circuit 210 generates a gate voltage (i.e., $V_T + V_{cc(A)}$, where $V_T$ is a threshold voltage of the biasing transistor 208) to bias the gate of the biasing transistor 208. The operation of the gate bias circuit 210 should be understood by those of skill in the art.

In operation, the voltage translator 106 receives the first voltage signal A as an input at the first I/O terminal A from the processor 102. When the first voltage signal transitions from the first state to the second state (such as from 0V to 1.8V), the first pulse generator 212a senses the transition, is activated, and generates the first pulse signal. The first driver circuit 214a receives the first pulse signal and enables the first output transistor 204a by way of the first driver signal. Once enabled, the first output transistor 204a pulls up a voltage level of the second I/O terminal B to the second voltage level of the second voltage supply $V_{cc(B)}$. Thus, the second voltage signal B having the second voltage level is provided at the second I/O terminal B. In other words, the voltage translator 106 receives input A at the first voltage level, and shifts it to the second voltage level provides the shifted voltage at the second I/O terminal B.

The second voltage signal also is fed back to the first driver circuit 214a since the drain of the first output transistor 204a is input to the first driver circuit 214a. When the first driver circuit 214a senses that the second voltage signal has a high slew-rate (i.e., change in voltage level of the second voltage signal per unit time), the first driver circuit 214a modulates the gate voltage of the first output transistor 204a to control its drive capability, thereby reducing the slew-rate of the second voltage signal B. The detailed operation of the first driver circuit 214a will be described in more detail below with reference to FIG. 4A.

When the first pulse signal is disabled (e.g., after 40 ns), the first driver signal is disabled, thereby turning off or disabling the first output transistor 204a. When the first output transistor 204a is disabled and the first voltage signal A is still at the second state, the second I/O terminal B is pulled up to the level of the second voltage supply $V_{cc(B)}$ by way of the first resistor R1. When the first voltage signal A transitions from the second state to the first state (i.e., from high to low), the second I/O terminal B is discharged by way of the biasing transistor 208 and is pulled down to ground.

In another scenario, the voltage translator 106 may receive the second voltage signal B as an input at the second I/O terminal B from the peripheral device 104. In such scenario, the second one-shot circuit 202b, the second output transistor 204b, and the second resistor R2 enable the voltage translator 106 to level shift the second voltage signal B to generate the first voltage signal A as an output at the first I/O terminal. The second pulse generator 212b is activated when the second voltage signal B transitions from the first state to the second state (such as from low i.e., 0V to high i.e., 3.6V) and generates the second pulse signal. The second driver circuit 214b receives the second pulse signal and enables the second output transistor 204b by way of the second gate driver signal. The second output transistor 204b then pulls up the first I/O terminal A to the level of the first voltage supply $V_{cc(A)}$, thereby providing the first voltage signal A at the first I/O terminal A. The second driver circuit 214b also receives the first voltage signal as feedback via being connected to the drain of the second output transistor 204b, which modulates the second gate driver signal to control the slew-rate of the first voltage signal A.

When the second pulse signal is disabled, the second gate driver signal is disabled, thereby disabling or turning off the second output transistor 204b. When the second output transistor 204b is disabled and the second voltage signal B is still at the second state, the first I/O terminal A is pulled up to the first voltage level by way of the second resistor R2. When the second voltage signal B transitions from the second state to the first state (i.e., from 3.6V to 0V), the first I/O terminal A discharges by way of the biasing transistor 208 and is pulled down to ground.

Figure 3:
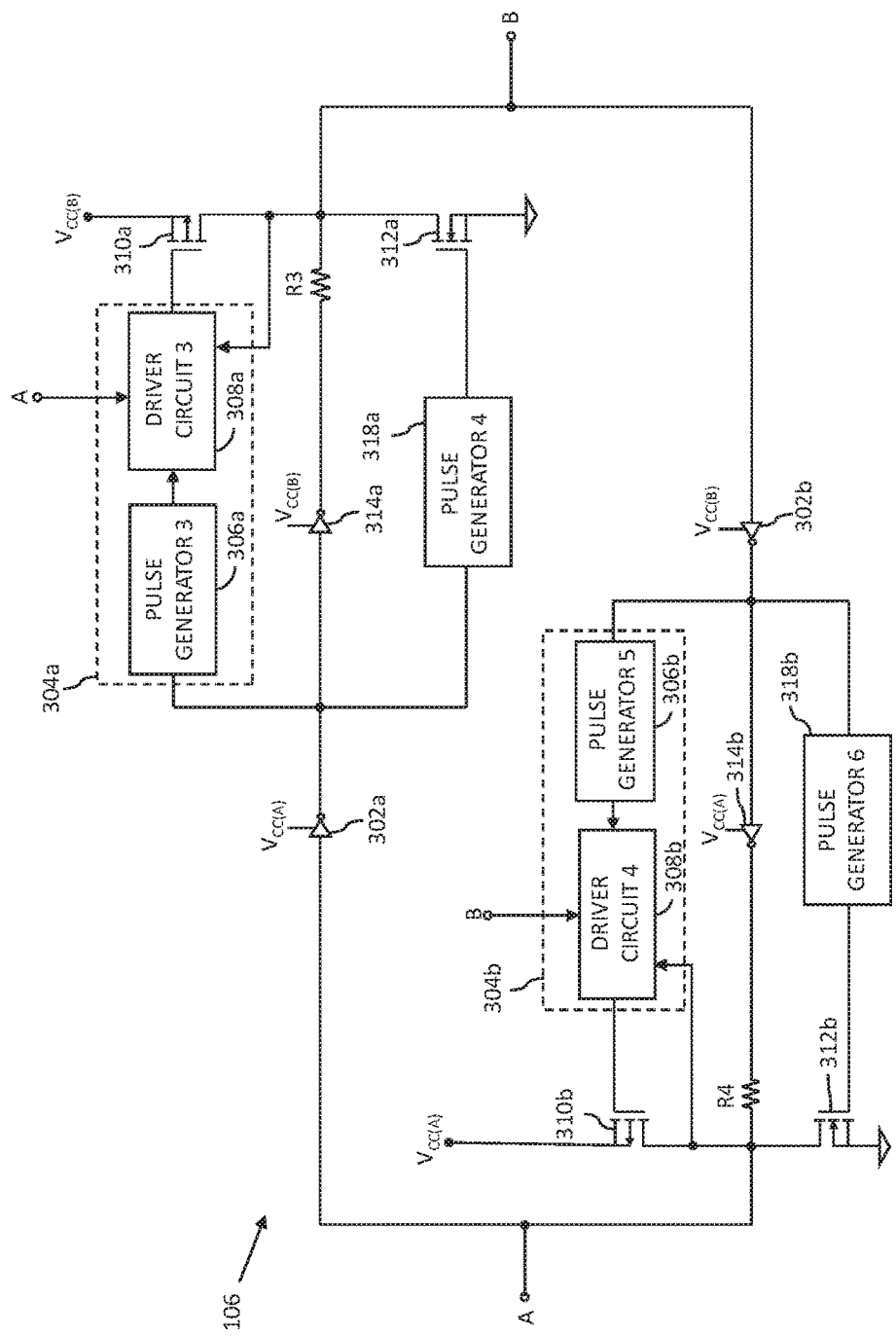
FIG. 3 is a schematic circuit diagram of a voltage translator in accordance with another embodiment of the present invention.

Referring now to FIG. 3, a schematic block diagram of the voltage translator 106, in accordance with another embodiment of the present invention, is shown. FIG. 3 shows a push-pull configuration of the voltage translator 106. The voltage translator 106 includes a first inverter 302a, a third one-shot circuit 304a including a third pulse generator 306a and a third driver circuit 308a, third and fourth output transistors 310a and 312a, a second inverter 314a, a third resistor R3, and a fourth pulse generator 318a. The voltage translator 106 further includes a third inverter 302b, a fourth one-shot circuit 304b including a fifth pulse generator 306b and a fourth driver circuit 308b, fifth and sixth output transistors 310b and 312b, a fourth inverter 314b, a fourth resistor R4, and a sixth pulse generator 318b. The third and fourth one-shot circuits 304a and 304b are structurally and functionally similar to the first and second one-shot circuits 202a and 202b, respectively, described above.

The first inverter 302a receives the first voltage signal A from the first input terminal A. The first inverter 302a also is connected to the first supply voltage $V_{cc(A)}$, and outputs a first inverter output. When the first voltage signal A is at the first state (i.e., low, 0V), the first inverter output has a voltage level equal to the level of the first supply voltage $V_{cc(A)}$. Conversely, when the first voltage signal is at the second state (i.e., high, 1.8V), the first inverter output is low (e.g., 0V).

The third one-shot circuit 304a is connected to the first inverter 302a for receiving the first inverter output. The third one-shot circuit 304a also is connected to the first and second I/O terminals A and B for receiving the first and second voltage signals A and B, respectively. The third one-shot circuit 304a generates a third pulse signal and a third gate driver signal by way of the third pulse generator 306a and the third driver circuit 308a, respectively. The third pulse generator 306a is connected to the first inverter 302a for receiving the first inverter output. The third pulse generator 306a is activated when the first inverter 302a output transitions from high to low, and generates the third pulse signal. The third driver circuit 308a is connected to the third pulse generator 306a and receives the third pulse signal. The third driver circuit 308a also is connected to the first and second I/O terminals for receiving the first and second voltage signals A and B, respectively. The third driver circuit 308a generates the third gate driver signal based on the second voltage signal and the third pulse signal.

The third output transistor 310a may be a PMOS transistor having a source terminal connected to the second supply voltage $V_{cc(B)}$, a drain terminal connected to the second I/O terminal B and also to the third driver circuit 308a for receiving a feedback signal, and a gate terminal connected to the third driver circuit 308a for receiving the third gate driver signal. The fourth output transistor 312a may be an NMOS transistor having a source terminal connected to ground, a drain terminal connected to the second I/O terminal B, and a gate terminal connected to the fourth pulse generator 318a.

The second inverter 314a is connected to the first inverter 302a for receiving the first inverter output. The second inverter 314a also is connected to the second supply voltage $V_{cc(B)}$. The second inverter 314a outputs a second inverter output. When the first inverter 302a output is low, then the output of the second inverter 314a is at a voltage level equal to the second supply voltage $V_{cc(B)}$. Conversely, when the output of the first inverter 302a is high, then the output of the second inverter 314a is low. The third resistor R3 is connected between the second inverter 314a and the second I/O terminal B.

The fourth pulse generator 318a is connected to the output of the first inverter 302a for receiving the first inverter output and the gate terminal of the fourth output transistor 312a. The fourth pulse generator 318a is activated when the first inverter output transitions from low to high and generates a fourth pulse signal, which is used to turn on and off the fourth output transistor 312a.

The third inverter 302b has an input connected to the second I/O terminal B for receiving the second voltage signal B. the third inverter 302b also is connected to the second supply voltage $V_{cc(B)}$. The third inverter 302b outputs a third inverter output. When the second voltage signal B is at the first state (i.e., low), the output of the third inverter 302b has a voltage level equal to the voltage level of the second supply voltage $V_{cc(B)}$. Conversely, when the second voltage signal B is at the second state (i.e., high), the output of the third inverter 302b is low (e.g., 0V).

The fourth one-shot circuit 304b is connected to the output of the third inverter 302b for receiving the third inverter output. The fourth one-shot circuit 304b also is connected to the first and second I/O terminals A and B for receiving the first and second voltage signals, respectively. The fourth one-shot circuit 304b generates a fifth pulse signal and a fourth gate driver signal by way of the fifth pulse generator 306b and the fourth driver circuit 308b, respectively. The fifth pulse generator 306b is connected to the output of the third inverter 302b for receiving the third inverter output. The fifth pulse generator 306b is activated when the third inverter output goes from high to low, and in response generates the fifth pulse signal. The fourth driver circuit 308b is connected to the fifth pulse generator 306b for receiving the fifth pulse signal. The fourth driver circuit 308b also is connected to the first and second I/O terminals A and B for receiving the first and second voltage signals, respectively. The fourth driver circuit 308b generates the fourth gate driver signal based on the first voltage signal A and the fifth pulse signal. The fourth driver circuit 308b also is connected to the drain of the fifth output transistor 310b, and in this way receives the first voltage signal A as a feedback signal.

The fifth output transistor 310b may be a PMOS transistor having a source terminal connected to the first supply voltage $V_{cc(A)}$, a drain terminal connected to the first I/O terminal A, and a gate terminal connected to the fourth driver circuit 308b for receiving the fourth gate driver signal. The sixth output transistor 312b may be an NMOS transistor having a source terminal connected to ground, a drain terminal connected to the first I/O terminal A and to the drain of the fifth output transistor 310b, and a gate terminal connected to the sixth pulse generator 318b.

The fourth inverter 314b has an input connected to the output of the third inverter 302b for receiving the third inverter output. The fourth inverter 314b also is connected to the first supply voltage $V_{cc(A)}$. The fourth inverter 314b generates a fourth inverter output. When the output of the third inverter 302b is low, the output of the fourth inverter 314b has a voltage level equal to the voltage level of the first supply voltage $V_{cc(A)}$. Conversely, when the output of the third inverter 302b is high, then the output of the fourth inverter 314b is low. The fourth resistor R4 is connected between the output of the fourth inverter 314b and the first I/O terminal A.

The sixth pulse generator 318b is connected to the output of the third inverter 302b for receiving the third inverter output and the gate of the sixth output transistor 312b. The sixth pulse generator 318b is activated when the output of the third inverter 302b goes from low to high (i.e., when the second voltage signal transitions from high to low), and when activated, generates a sixth pulse signal, which is provided at the gate of the sixth output transistor 312b.

In operation, the voltage translator 106 receives the first voltage signal A as an input at the first I/O terminal A from the processor 102. When the first voltage signal A transitions from the first state to the second state (such as from 0V to 1.8V), the third pulse generator 306a is activated based on the first inverter output. Upon activation, the third pulse generator 306a generates the third pulse signal. The third driver circuit 308a receives the third pulse signal and enables the third output transistor 310a by way of the third driver signal. Once enabled, the third output transistor 310a pulls up a voltage level of the second I/O terminal B to the voltage level of the second voltage supply $V_{cc(B)}$, thereby outputting the second voltage signal B at the second I/O terminal B. The second voltage signal B also is fed back to the third driver circuit 308a. When the third driver circuit 308a senses that the second voltage signal has a high slew-rate, the third driver circuit 308a modulates the gate voltage of the third output transistor 310a to control the slew-rate of the second voltage signal B.

When the third pulse signal from the third pulse generator 306a is disabled (e.g., after 40 ns), the third driver signal also is disabled, thereby disabling the third output transistor 310a. When the third output transistor 310a is disabled and the first voltage signal is still at the second state, the second I/O terminal B is pulled up to the voltage level of the second voltage supply $V_{cc(B)}$ by way of the third resistor R3.

When the first voltage signal A transitions from the second state to the first state (i.e., from high to low), the fourth pulse generator 318a is activated based on the first inverter output and generates the fourth pulse signal, which enables the fourth output transistor 312a. Once enabled, the fourth output transistor 312a pulls the voltage level of the second I/O terminal B down to ground. When the fourth pulse signal is disabled (e.g., after 40 ns), the fourth output transistor 312a also is disabled. When the fourth output transistor 312a is disabled and the first voltage signal is still at the first state, the second I/O terminal B is pulled down to ground by way of the third resistor R3.

In another scenario, the voltage translator 106 may receive the second voltage signal B as an input at the second I/O terminal B from the peripheral device 104. In such a scenario, the third inverter 302b, the fourth one-shot circuit 304b, the fifth and sixth output transistors 310b and 312b, the fourth inverter 314b, the fourth resistor R4, and the sixth pulse generator 318b cause the voltage translator 106 to generate the first voltage signal A as an output at the first I/O terminal A. When the second voltage signal B transitions from the first state to the second state, the fifth pulse generator 306b generates the fifth pulse signal, which causes the fourth driver circuit 308b to generate the fourth driver signal to enable the fifth output transistor 310b. The fifth output transistor 310b pulls-up a voltage level of the first I/O terminal A to the voltage level of the first voltage supply $V_{cc(A)}$, so the first voltage signal A is output at the first I/O terminal A. The fourth driver circuit 308b receives the first voltage signal A as feedback and controls the slew-rate of the first voltage signal A by modulating the gate voltage of the fifth output transistor 310b.

When the fifth pulse signal is disabled (e.g., after 40 ns), the fourth driver signal also is disabled, thereby disabling the fifth output transistor 310b. The first I/O terminal A is pulled up to the first voltage level of the first voltage supply $V_{cc(A)}$ by way of the fourth resistor R4 when the fifth output transistor 310b is disabled and the second voltage signal is at the second state.

When the second voltage signal transitions from the second state to the first state (i.e., from high to low), the sixth pulse generator 318b is activated and generates the sixth pulse signal, which enables the sixth output transistor 312b. The sixth output transistor 312b pulls-down the voltage level of the first I/O terminal A to ground. When the sixth pulse signal is disabled (e.g., after 40 ns), the sixth output transistor 312b also is disabled. If the sixth output transistor 312b is disabled and the second voltage signal B is still at the first state, the first I/O terminal A is pulled down to ground by way of the fourth resistor R4.

It will be appreciated that the pulse generators 318a and 318b look like the one-shot circuits 304a and 304b to add slew rate control to falling edges.

Figure 4A:
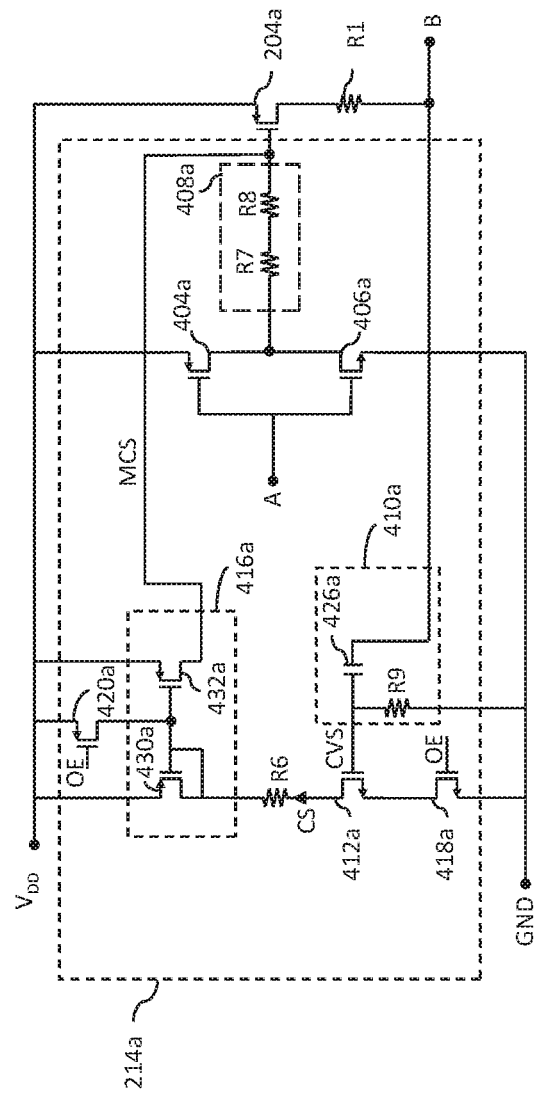
FIGS. 4A and 4B are schematic circuit diagrams of first and second driver circuits of the voltage translator of FIG. 2 in accordance with an embodiment of the present invention.

Referring now to FIG. 4A, a schematic circuit diagram of the first driver circuit 214a, in accordance with an embodiment of the present invention, is shown. The first output transistor 204a is connected to the second I/O terminal B by way of the first resistor R1. The first driver circuit 214a includes first and second transistors 404a and 406a, a first resistive network 408a, a first high-pass filter (HPF) 410a, a first current source 412a, a sixth resistor R6, a first current mirror circuit 416a, and third and fourth transistors 418a and 420a. In one embodiment, the first current source 412a comprises a MOS transistor.

The first transistor 404a may be a PMOS transistor having a source terminal connected to a third supply voltage $V_{DD}$, a drain terminal connected to a drain terminal of the second transistor 406a, and a gate connected to the first I/O terminal A for receiving the first voltage signal. The second transistor 406a may be an NMOS transistor having a source terminal connected to ground and a gate connected to the first I/O terminal A for receiving the first voltage signal. As will be understood by those of skill in the art, the first and second transistors 404a and 406a form an inverter.

When the first voltage signal A is at the first state, the first transistor 404a is enabled and the second transistor 406a is disabled. When the first transistor 404a is enabled, the drain of the first transistor 404a is pulled up to a voltage level of the third supply voltage $V_{DD}$. Conversely, when the first voltage signal A is at the second state, the first transistor 404a is disabled or turned off and the second transistor 406a is enabled. When the second transistor 406a is enabled, the drain of the second transistor 406a is pulled down to ground.

The first resistive network 408a is connected between the gate of the first output transistor 204a and the drains of the first and second transistors 404a and 406a. The first resistive network 408a includes seventh and eighth resistors R7 and R8 connected in series, such that the seventh resistor R7 is connected to the drains of the first and second transistors 404a and 406a, and the eighth resistor R8 is connected to the gate of the first output transistor 204a. It will be understood by those of skill in the art that the first resistive network 408a can include more or fewer than two resistors. The first gate voltage of the first output transistor 204a is based on a voltage drop across the seventh and eighth resistors R7 and R8.

The first HPF 410a is connected to the drain of the first output transistor 204a by way of the first resistor R1 for receiving the second voltage signal B as feedback. The HPF 410a generates a control voltage signal CVS that is proportional to the slew-rate of the second voltage signal B. The first HPF 410a includes a resistor-capacitor pair including a fourth capacitor 426a and a ninth resistor R9. It will be understood by those of skill in the art that the first HPF 410a may include additional resistor-capacitor pairs.

The fourth capacitor 426a is connected between the second I/O terminal B and the gate of the first current source 412a. The ninth resistor R9 is connected between the gate of the first current source 412a and ground. The ninth resistor 428a further is connected to the fourth capacitor 426a. The first HPF 410a blocks the second voltage signal when the slew-rate of the second voltage signal is below a threshold value, and generates the control voltage signal CVS when the slew-rate of the second voltage signal is greater than the threshold value. It will be understood by those of skill in the art that the threshold value is a system parameter that is based on a value of capacitance and resistance of the fourth capacitor 426a and the ninth resistor R9, respectively.

In the presently preferred embodiment, the first current source 412a is an NMOS transistor that has a source connected to the drain of the third transistor 418a, a gate connected to the first HPF 410a for receiving the control voltage signal CVS, and a drain connected to the sixth resistor R6. The first current source 412a generates a current signal CS that is proportional to the control voltage signal CVS at its drain. If a voltage level of the control voltage signal CVS increases, an amplitude of the current signal CS increases.

The first current mirror circuit 416a is connected to the first current source 412a by way of the sixth resistor R6 and receives the current signal CS, and generates a mirrored current signal MCS, which is provided to the gate of the first output transistor 204a. The first current mirror circuit 416a includes fifth and sixth transistors 430a and 432a. The fifth transistor 430a may be a PMOS transistor having a source connected to the third supply voltage $V_{DD}$ and a drain connected to the drain of the first current source 412a by way of the sixth resistor R6. The drain of the fifth transistor 430a also is connected to its gate. The sixth transistor 432a may be a PMOS transistor having a source connected to the third supply voltage $V_{DD}$ and a gate connected to the gate of the fifth transistor 430a. The sixth transistor 432a outputs the mirrored current signal MCS at its drain. The drain of the sixth transistor 432a is connected to the first resistive network 408a and the gate of the first output transistor 204a. As the first resistive network 408a receives the mirrored current signal MCS, the voltage drop across the first resistive network 408a is altered, which in turn alters the gate voltage of the first output transistor 204a.

The third transistor 418a may be an NMOS transistor having a source connected to ground and a drain connected to the source of the first current source 412a. The fourth transistor 420a may be a PMOS transistor having a source connected to the third supply voltage $V_{DD}$ and a drain connected to the first current mirror circuit 416a. The third and fourth transistors 418a and 420a control the operation of the first driver circuit 214a. For example, when the third transistor 418a is enabled and the fourth transistor 420a is disabled, the first driver circuit 214a is activated. Conversely, when the third transistor 418a is disabled and the fourth transistor 420a is enabled, the first driver circuit 214a is deactivated. The third and fourth transistors 418a and 420a are controlled by an output enable signal OE that is provided at their gates. For example, when the output enable signal OE is inactive, the third transistor 418a is disabled and the fourth transistor 420a is enabled, thereby deactivating the first driver circuit 214a. Conversely, when the output enable signal OE is active, the third transistor 418a is enabled and the fourth transistor 420a is disabled, thereby activating the first driver circuit 214a.

In operation, when the first voltage signal A at the first I/O terminal A goes from the first state to the second state (i.e., from 0V to 1.8V), the second voltage signal B also transitions from the first state to the second state (i.e., from 0V to 3.6V). The first HPF 410a receives the second voltage signal as feedback. When the first HPF 410a senses that the slew-rate of the second voltage signal has increased beyond the threshold value, the first HPF 410a generates the control voltage signal CVS.

The control voltage signal CVS enables the first current source 412a. As the first current source 412a is enabled, the current signal CS, which is proportional to the control voltage signal CVS, is generated at the drain of the first current source 412a. The first current mirror circuit 416a receives the current signal CS from the first current source 412a by way of the sixth resistor R6 and generates the mirrored current signal MCS.

Based on the mirrored current signal MCS, the voltage drop across the first resistive network 408a increases, which causes the gate voltage of the first output transistor 204a to decrease. As the gate voltage of the first output transistor 204a decreases, the drive capability of the first output transistor 204a is reduced, thereby reducing the slew-rate of the second voltage signal.

It will be apparent to a person having ordinary skill in the art that the third driver circuit 308a operates in a similar manner as the first driver circuit 214a (discussed above).

Figure 4B:
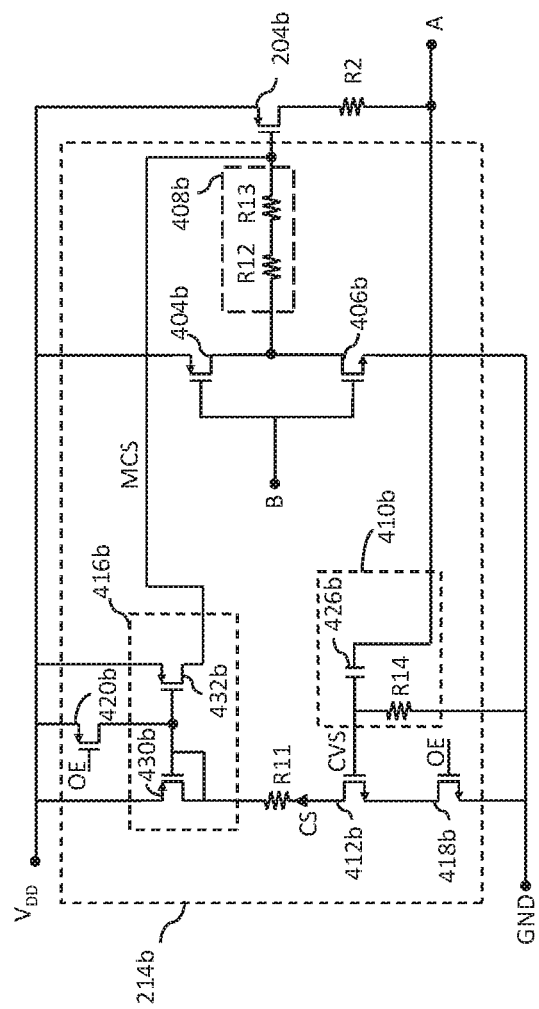

Referring now to FIG. 4B, a schematic circuit diagram of the second driver circuit 214b, in accordance with an embodiment of the present invention, is shown. The second output transistor 204b is connected to the first I/O terminal A by way of the second resistor R2.

The second driver circuit 214b includes seventh and eighth transistors 404b and 406b, a second resistive network 408b, a second high-pass filter (HPF) 410b, a second current source 412b, an eleventh resistor R11, a second current mirror circuit 416b, and ninth and tenth transistors 418b and 420b. The second resistive network 408b includes twelfth and thirteenth resistors R12 and R13 connected in series. The second HPF 410b includes a fifth capacitor 426b and a fourteenth resistor R14. The second current mirror circuit 416b includes eleventh and twelfth transistors 430b and 432b. The second driver circuit 214b is structurally and functionally similar to the first driver circuit 214a, such that for the second driver circuit 214b the second voltage signal B is received as an input at the second I/O terminal B and the first voltage signal A is generated as an output at the first I/O terminal A. The second driver circuit 214b controls the slew-rate of the first voltage signal A when the second voltage signal B goes from the first state to the second state.

It will be apparent to a person having ordinary skill in the art that the fourth driver circuit 308b operates in a similar manner as the second driver circuit 214b (described above).

The voltage translator 106 controls the drive capabilities of the first and second output transistors 204a and 204b (or the third and fifth output transistors 310a and 310b) based on the slew rate of an output voltage signal (i.e., the first or second voltage signal, respectively). If the slew rate of the output voltage signal increases beyond a threshold value, the voltage translator 106 reduces the drive capability of the corresponding output transistor, which results in the reduction of the slew-rate of the output voltage signal. Reduction in the slew-rate of the output voltage signal prevents undesirable overshoot in the voltage level of the output voltage signal, which is caused by increasing slew-rate. As the voltage translator 106 controls the slew-rate based on the feedback of the output voltage signal, an additional clamping circuit is not required to clamp the overshoot, thereby reducing cost and complexity of the voltage translator 106.

It will be understood by those of skill in the art that the same logical function may be performed by different arrangements and configurations of transistors, resistors, capacitors, or that electronic circuits operate using either positive or negative signals. Therefore, variations in the arrangement and configurations of some of the transistors, resistors, capacitors described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A bidirectional voltage translator, comprising:
a first one-shot circuit that (i) receives a first voltage signal and generates a first pulse signal when the first voltage signal transitions from a first state to a second state, and (ii) receives a second voltage signal and generates a first gate driver signal using the second voltage signal and the first pulse signal;
a first output transistor connected to the first one-shot circuit for receiving the first gate driver signal and generating the second voltage signal, wherein the second voltage signal is fed back to the first one-shot circuit to control a first gate voltage of the first output transistor based on a slew-rate of the second voltage signal;
a second one-shot circuit that (i) receives the second voltage signal and generates a second pulse signal when the second voltage signal transitions from the first state to the second state, and (ii) receives the first voltage signal and generates a second gate driver signal using the first voltage signal and the second pulse signal; and
a second output transistor connected to the second one-shot circuit for receiving the second gate driver signal and generating the first voltage signal, wherein the first voltage signal is fed back to the second one-shot circuit to control a second gate voltage of the second output transistor based on a slew-rate of the first voltage signal.

2. The bidirectional voltage translator of claim 1, wherein:
the first one-shot circuit comprises:
a first pulse generator that receives the first voltage signal and generates the first pulse signal when the first voltage signal transitions from the first state to the second state; and
a first driver circuit that receives the first and second voltage signals and the first pulse signal, and generates the first gate driver signal; and
the second one-shot circuit comprises:
a second pulse generator that receives the second voltage signal and generates the second pulse signal when the second voltage signal transitions from the first state to the second state; and
a second driver circuit that receives the first and second voltage signals and the second pulse signal, and generates the second gate driver signal.

3. The bidirectional voltage translator of claim 2, wherein the first driver circuit comprises:
a high-pass filter that receives the second voltage signal from the first output transistor, and outputs a control voltage signal that is proportional to the slew-rate of the second voltage signal;
a current source connected to the high-pass filter for receiving the control voltage signal, and generating a current signal; and
a current mirror circuit connected to the current source for receiving the current signal, and generating a mirrored current signal, wherein the first gate voltage of the first output transistor is controlled with the mirrored current signal.

4. The bidirectional voltage translator of claim 3, wherein the first driver circuit further comprises:
a first transistor having a drain terminal connected to the current mirror circuit, and a gate terminal that receives an output enable signal; and
a second transistor having a drain terminal connected to the current source and a gate terminal that receives the output enable signal, wherein the bidirectional voltage translator is activated based on the output enable signal.

5. The bidirectional voltage translator of claim 3, wherein the first driver circuit further comprises:
a first transistor having a gate terminal that receives the first voltage signal;
a second transistor having a drain terminal connected to a drain terminal of the first transistor, and a gate terminal that receives the first voltage signal; and
a resistive network connected between the drain terminal of the first transistor and the gate terminal of the first output transistor, and receiving the mirrored current signal, wherein the first gate voltage of the first output transistor is based on a voltage drop across the resistive network.

6. The bidirectional voltage translator of claim 3, wherein the high-pass filter comprises at least one resistor-capacitor pair.

7. The bidirectional voltage translator of claim 3, wherein the current mirror circuit comprises:
a first transistor having a gate terminal connected to a drain terminal thereof, wherein the drain terminal of the first transistor receives the current signal from the current source; and
a second transistor having a gate terminal connected to the gate terminal of the first transistor for receiving the current signal and a drain terminal that generates the mirrored current signal.

8. The bidirectional voltage translator of claim 2, wherein the second driver circuit comprises:
a high-pass filter that receives the first voltage signal from the second output transistor, and outputs a control voltage signal that is proportional to the slew-rate of the first voltage signal;
a current source connected to the high-pass filter for receiving the control voltage signal, and generating a current signal; and
a current mirror circuit connected to the current source for receiving the current signal, and generating a mirrored current signal, wherein the second gate voltage of the second output transistor is controlled with the mirrored current signal.

9. The bidirectional voltage translator of claim 8, wherein the second driver circuit further comprises:
a first transistor having a drain terminal connected to the current mirror circuit and a gate terminal that receives an output enable signal; and
a second transistor having a drain terminal connected to the current source and a gate terminal that receives the output enable signal, wherein the bidirectional voltage translator is activated based on the output enable signal.

10. The bidirectional voltage translator of claim 8, wherein the second driver circuit further comprises:
a first transistor having a gate terminal that receives the second voltage signal;
a second transistor having a drain terminal connected to a drain terminal of the first transistor, and a gate terminal that receives the second voltage signal; and
a resistive network connected between the drain terminal of the first transistor and the gate terminal of the first output transistor, and receiving the mirrored current signal, wherein the second gate voltage of the second output transistor is based on a voltage drop across the resistive network.

11. The bidirectional voltage translator of claim 8, wherein:
the high-pass filter comprises one or more resistor-capacitor pairs; and
the current mirror circuit comprises:
a first transistor having a gate terminal connected to a drain terminal thereof, wherein the drain terminal of the first transistor receives the current signal from the current source; and
a second transistor having a gate terminal connected to the gate terminal of the first transistor for receiving the current signal and a drain terminal for generating the mirrored current signal.

12. The bidirectional voltage translator of claim 1, further comprising:
a biasing transistor that receives the first and second voltage signals, wherein the biasing transistor pulls the second voltage signal to ground when the first voltage signal is at the first state and pulls the first voltage signal to ground when the second voltage signal is at the first state.

13. The bidirectional voltage translator of claim 1, further comprising:
a first pulse generator that generates a third pulse signal when the first voltage signal transitions from the second state to the first state;
a third output transistor connected to the first pulse generator for receiving the third pulse signal, and generating the second voltage signal, wherein the third output transistor pulls the second voltage signal to ground when the first voltage signal is at the first state;
a second pulse generator that generates a fourth pulse signal when the second voltage signal transitions from the second state to the first state; and
a fourth output transistor connected to the second pulse generator for receiving the fourth pulse signal, and generating the first voltage signal, wherein the fourth output transistor pulls the first voltage signal to ground when the second voltage signal is at the first state.

14. A system for interfacing a first digital device that operates at a first voltage level and a peripheral device that operates at a second voltage level that is different from the first voltage level, the system comprising:
a first one-shot circuit that (i) receives a first voltage signal from the first digital device and generates a first pulse signal when the first voltage signal transitions from a first state to a second state, (ii) receives a second voltage signal and generates a first gate driver signal using the second voltage signal and the first pulse signal;
a first output transistor connected to the first one-shot circuit for receiving the first gate driver signal and generating the second voltage signal, wherein the second voltage signal is fed back to the first one-shot circuit to control a first gate voltage of the first output transistor based on a slew-rate of the second voltage signal, and wherein the second voltage signal is provided to the peripheral device;
a second one-shot circuit that (i) receives the second voltage signal and generates a second pulse signal when the second voltage signal transitions from the first state to the second state, and (ii) receives the first voltage signal and generates a second gate driver signal using the first voltage signal and the second pulse signal; and
a second output transistor connected to the second one-shot circuit for receiving the second gate driver signal and generating the first voltage signal, wherein the first voltage signal is fed back to the second one-shot circuit to control a second gate voltage of the second output transistor based on a slew-rate of the first voltage signal, and wherein the first voltage signal is provided to the first digital device.

15. The system of claim 14, wherein the first one-shot circuit comprises:
a first pulse generator that receives the first voltage signal and generates the first pulse signal when the first voltage signal transitions from the first state to the second state; and
a first driver circuit that receives the first and second voltage signals and the first pulse signal, and generates the first gate driver signal; and
the second one-shot circuit comprises:
a second pulse generator that receives the second voltage signal and generates the second pulse signal when the second voltage signal transitions from the first state to the second state; and
a second driver circuit that receives the first and second voltage signals and the second pulse signal, and generates the second gate driver signal.

16. The system of claim 15, wherein the first driver circuit comprises:
a high-pass filter that receives the second voltage signal from the first output transistor, and outputs a control voltage signal that is proportional to the slew-rate of the second voltage signal;
a current source connected to the high-pass filter for receiving the control voltage signal, and generating a current signal;
a current mirror circuit connected to the current source for receiving the current signal, and generating a mirrored current signal, wherein the first gate voltage of the first output transistor is controlled with the mirrored current signal;
a first transistor having a drain terminal connected to the current mirror circuit, and a gate terminal that receives an output enable signal; and
a second transistor having a drain terminal connected to the current source, and a gate terminal that receives the output enable signal, wherein the system is activated based on the output enable signal;
a third transistor having a gate terminal that receives the first voltage signal;
a fourth transistor having a drain terminal connected to a drain terminal of the third transistor and a gate terminal that receives the first voltage signal; and
a resistive network connected between the drain terminal of the third transistor and the gate terminal of the first output transistor, and receiving the mirrored current signal from the current mirror circuit, wherein the first gate voltage of the first output transistor is based on a voltage drop across the resistive network.

17. The system of claim 16, wherein the high-pass filter comprises one or more resistor-capacitor pairs; and
the current mirror circuit comprises:
a fifth transistor having a gate terminal connected to a drain terminal thereof, wherein the drain terminal of the fifth transistor receives the current signal from the current source; and
a sixth transistor having a gate terminal connected to the gate terminal of the fifth transistor for receiving the current signal and a drain terminal that generates the mirrored current signal.

18. The system of claim 15, wherein the second driver circuit comprises:
a high-pass filter that receives the first voltage signal from the second output transistor, and outputs a control voltage signal that is proportional to the slew-rate of the first voltage signal;
a current source connected to the high-pass filter for receiving the control voltage signal, and generating a current signal; and
a current mirror circuit connected to the current source for receiving the current signal, and generating a mirrored current signal, wherein the second gate voltage of the second output transistor is controlled with the mirrored current signal;
a first transistor having a drain terminal connected to the current mirror circuit and a gate terminal that receives an output enable signal;
a second transistor having a drain terminal connected to the current source and a gate terminal that receives the output enable signal, wherein the system is activated based on the output enable signal;

a third transistor having a gate terminal that receives the second voltage signal;

a fourth transistor having a drain terminal connected to a drain terminal of the second transistor and a gate terminal that receives the second voltage signal; and a resistive network connected between the drain terminal of the third transistor and the gate terminal of the second output transistor, and receiving the mirrored current signal from the current mirror circuit, wherein the second gate voltage of the second output transistor is based on a voltage drop across the resistive network.

19. The system of claim 18, wherein the high-pass filter comprises at least one resistor-capacitor pair; and the current mirror circuit comprises:

a fifth transistor having a gate terminal connected to a drain terminal thereof, wherein the drain terminal of the fifth transistor receives the current signal from the current source; and a sixth transistor having a gate terminal connected to the gate terminal of the fifth transistor for receiving the current signal and a drain terminal for generating the mirrored current signal.

20. The system of claim 14, wherein the system has one of an open-drain configuration and a push-pull configuration.

\* \* \* \* \*